(12) United States Patent
Basceri et al.

(10) Patent No.: US 11,710,732 B2
(45) Date of Patent: *Jul. 25, 2023

(54) BACK-TO-BACK SOLID STATE LIGHTING DEVICES AND ASSOCIATED METHODS

(71) Applicant: Micron Technology, Inc., Boise, ID (US)

(72) Inventors: Cem Basceri, Los Gatos, CA (US); Casey Kurth, Boise, ID (US); Kevin Tetz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

This patent is subject to a terminal disclaimer.

(21) Appl. No.: 17/330,086

(22) Filed: May 25, 2021

(65) Prior Publication Data

US 2021/0288041 A1 Sep. 16, 2021

Related U.S. Application Data

(60) Continuation of application No. 16/046,686, filed on Jul. 26, 2018, now Pat. No. 11,037,918, which is a
(Continued)

(51) Int. Cl.
*H01L 25/00* (2006.01)
*H01L 33/38* (2010.01)
*H01L 25/075* (2006.01)
*H01L 33/48* (2010.01)
*H01L 33/50* (2010.01)
(Continued)

(52) U.S. Cl.
CPC .......... *H01L 25/50* (2013.01); *H01L 25/0756* (2013.01); *H01L 33/382* (2013.01); *H01L 33/486* (2013.01); *H01L 33/501* (2013.01); *H01L 33/62* (2013.01); *H01L 2924/0002* (2013.01); *H01L 2933/0033* (2013.01); *H01L 2933/0041* (2013.01); *H05K 1/0203* (2013.01);
(Continued)

(58) Field of Classification Search
CPC ... H01L 25/50; H01L 25/0756; H01L 33/382; H01L 33/486; H01L 33/501; H01L 33/62; H01L 2924/0002; H01L 2933/0033; H01L 2933/0041; H05K 1/0203; H05K 1/0306; H05K 2201/10106
USPC ......................................................... 438/28
See application file for complete search history.

(56) References Cited

U.S. PATENT DOCUMENTS 5,509,200 A  4/1996 Frankeny et al.
6,042,248 A  3/2000 Hannah et al.
(Continued)

*Primary Examiner* — Tu-Tu V Ho
(74) *Attorney, Agent, or Firm* — Perkins Coie LLP

(57) ABSTRACT

Solid state lights (SSLs) including a back-to-back solid state emitters (SSEs) and associated methods are disclosed herein. In various embodiments, an SSL can include a carrier substrate having a first surface and a second surface different from the first surface. First and second through substrate interconnects (TSIs) can extend from the first surface of the carrier substrate to the second surface. The SSL can further include a first and a second SSE, each having a front side and a back side opposite the front side. The back side of the first SSE faces the first surface of the carrier substrate and the first SSE is electrically coupled to the first and second TSIs. The back side of the second SSE faces the second surface of the carrier substrate and the second SSE is electrically coupled to the first and second TSIs.

20 Claims, 4 Drawing Sheets

Related U.S. Application Data continuation of application No. 15/252,156, filed on Aug. 30, 2016, now Pat. No. 10,062,677, which is a division of application No. 12/874,396, filed on Sep. 2, 2010, now Pat. No. 9,443,834.

(51) Int. Cl.
  *H01L 33/62* (2010.01)
  *H05K 1/02* (2006.01)
  *H05K 1/03* (2006.01)

(52) U.S. Cl.
  CPC . *H05K 1/0306* (2013.01); *H05K 2201/10106* (2013.01)

(56) References Cited

U.S. PATENT DOCUMENTS

| | | |
|---|---|---|
| 6,936,855 B1 | 8/2005 | Harrah |
| 7,027,849 B2 | 4/2006 | Al-Ali |
| 7,282,748 B2 | 10/2007 | Takeda et al. |
| 8,049,330 B2 | 11/2011 | Tain et al. |
| 8,450,756 B2 | 5/2013 | Strickler et al. |
| 9,443,834 B2 | 9/2016 | Basceri et al. |
| 10,062,677 B2 | 8/2018 | Basceri et al. |
| 11,037,918 B2 * | 6/2021 | Basceri ................. H01L 33/486 |
| 2003/0010975 A1 | 1/2003 | Gibb et al. |
| 2003/0011538 A1 | 1/2003 | Lys et al. |
| 2003/0164503 A1 | 9/2003 | Chen et al. |
| 2004/0125344 A1 | 7/2004 | Matsui |
| 2004/0239242 A1 | 12/2004 | Mano et al. |
| 2007/0096272 A1 | 5/2007 | Wang et al. |
| 2007/0246716 A1 | 10/2007 | Bhat et al. |
| 2007/0280585 A1 | 12/2007 | Warashina et al. |
| 2008/0211416 A1 | 9/2008 | Negley et al. |
| 2008/0218095 A1 | 9/2008 | Erhardt |
| 2008/0231214 A1 | 9/2008 | Kim et al. |
| 2009/0080193 A1 | 3/2009 | Peck et al. |
| 2009/0115049 A1 | 5/2009 | Shiraishi et al. |
| 2009/0237897 A1 | 9/2009 | Ratcliffe et al. |
| 2010/0032691 A1 | 2/2010 | Kim |
| 2010/0065948 A1 | 3/2010 | Bae et al. |
| 2010/0213479 A1 | 8/2010 | Li et al. |
| 2010/0253221 A1 | 10/2010 | Chiang |
| 2011/0266579 A1 | 11/2011 | Nagai |
| 2012/0056219 A1 | 3/2012 | Basceri et al. |
| 2016/0372451 A1 | 12/2016 | Basceri et al. |
| 2018/0358344 A1 | 12/2018 | Basceri et al. |

* cited by examiner

BACK-TO-BACK SOLID STATE LIGHTING DEVICES AND ASSOCIATED METHODS

CROSS-REFERENCE TO RELATED APPLICATION

This application is a continuation of U.S. application Ser. No. 16/046,686, filed Jul. 26, 2018, which is a continuation of U.S. application Ser. No. 15/252,156, filed Aug. 30, 2016, now U.S. Pat. No. 10,062,677, which is a divisional of U.S. application Ser. No. 12/874,396, filed Sep. 2, 2010, now U.S. Pat. No. 9,443,834, each of which is incorporated herein by reference in its entirety.

TECHNICAL FIELD

The present technology is related to solid state lights ("SSLs") and associated methods of operation and manufacture. In particular, the present disclosure is related to SSLs having at least two solid state emitters ("SSEs") oriented in a back-to-back configuration and associated methods of packaging.

BACKGROUND

Solid state lights ("SSLs") use solid state emitters ("SSEs") as sources of illumination. Generally, SSLs generate less heat, provide greater resistance to shock and vibration, and have longer life spans than conventional lighting devices that use filaments, plasma, or gas as sources of illumination (e.g., florescent or incandescent lights).

A conventional type of SSL is a "white light" SSE. White light requires a mixture of wavelengths to be perceived as white by human eyes. However, SSEs typically only emit light at one particular wavelength (e.g., blue light), so SSEs must be modified to generate white light. One conventional technique for modulating the light from SSEs includes depositing a converter material (e.g., phosphor) on the SSE. For example, FIG. 1A shows a conventional SSL 10 that includes a support 2, an SSE 4 attached to the support 2, and a converter material 6 on the SSE 4. The SSE 4 typically emits blue light that stimulates the converter material 6 to emit light at a desired frequency (e.g., yellow light). The combination of the emissions from the SSE 4 and the converter material 6 appears white to human eyes if the wavelengths of the emissions are matched appropriately.

FIG. 1B shows a conventional structure for the SSE 4 that includes a silicon substrate 12, an N-type gallium nitride ("GaN") material 14, an indium gallium nitride ("InGaN") material 16 and/or GaN multiple quantum wells, and a P-type GaN material 18 on one another in series. The SSE 4 shown in FIG. 1B can be a lateral-type device that includes a first contact 20 on the P-type GaN material 18 and a second contact 22 on the N-type GaN material 14 spaced laterally apart from the first contact 20.

One challenge associated with conventional SSLs (e.g., the SSL 10 shown in FIG. 1A) is that SSL packages generally only emit light from a single plane. For example, a conventional SSL can include a plurality of SSEs arranged in an array on one surface of a carrier substrate. The combination of conventional SSLs to multiple planes of a package can complicate manufacture and increase the vertical and lateral size of the package. However, devices having multi-plane light emission are desirable for many applications (e.g., light posts).

Another challenge associated with conventional SSLs is that some of the components are sensitive to heat. Although SSLs produce less heat than conventional lighting devices, the heat generated by the SSEs can cause such heat sensitive components to deteriorate and fail over time. For example, the phosphor and the junctions in the light producing materials deteriorate at a faster rate at higher temperatures than at lower temperatures. The deterioration of the phosphor causes the light to change color over time, and the deterioration of the junctions reduces the light output at a given current (i.e., reduces the efficiency) and the life span of the device. Adding SSEs to a SSL device increases the heat of the device and thus accelerates the deterioration of the heat sensitive components.

DETAILED DESCRIPTION

Specific details of several embodiments of solid state lights ("SSLs") and associated methods of manufacturing SSLs are described below. The term "SSL" generally refers to "solid state light" and/or "solid state lighting device" according to the context in which it is used. The term "SSE" generally refers to solid state components that convert electrical energy into electromagnetic radiation in the visible, ultraviolet, infrared and/or other spectra. SSEs include semiconductor light-emitting diodes ("LEDs"), polymer light-emitting diodes ("PLEDs"), organic light-emitting diodes ("OLEDs"), or other types of solid state devices that convert electrical energy into electromagnetic radiation in a desired spectrum. The term "phosphor" generally refers to a material that can continue emitting light after exposure to energy (e.g., electrons and/or photons). Additionally, packaged SSLs and methods of manufacturing SSL assemblies are specifically described below to provide an enabling disclosure, but the package and methods can be applied to other SSLs as well. A person skilled in the relevant art will understand that the new technology may have additional embodiments and that the new technology may be practiced without several of the details of the embodiments described below with reference to FIGS. 2-6.

Figure 1A:
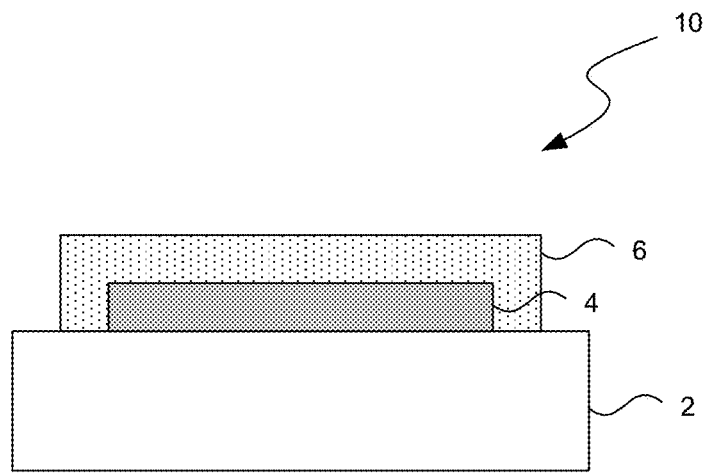
FIG. 1A is a cross-sectional view of a conventional SSL in accordance with the prior art.
Figure 1B:
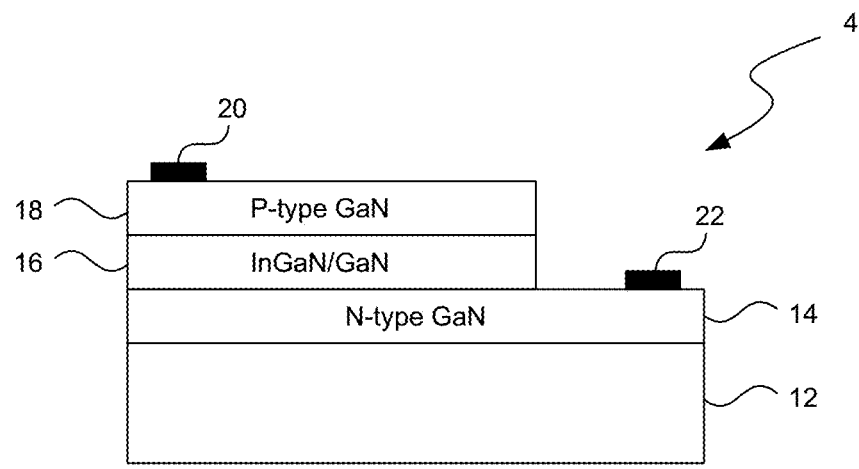
FIG. 1B is a cross-sectional view of an SSE in accordance with the prior art.
Figure 2:
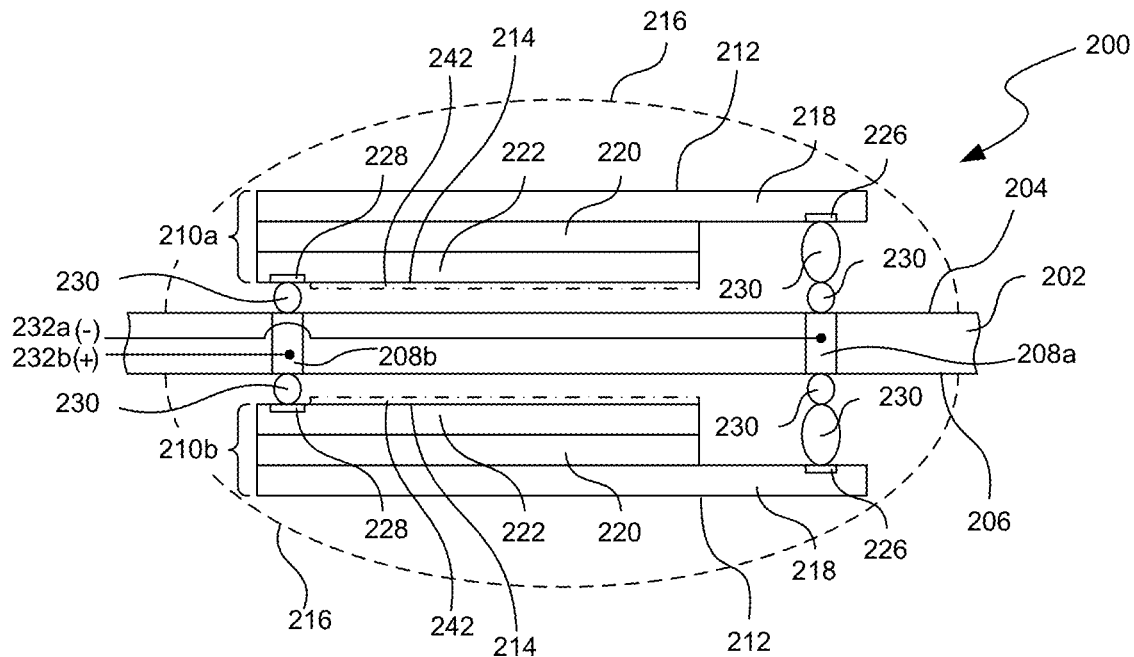
FIG. 2 is a partially schematic cross-sectional view of a back-to-back SSL in accordance with several embodiments of the new technology.

FIG. 2 illustrates a back-to-back SSL 200 configured in accordance with several embodiments of the new technology. The SSL 200 can include a carrier substrate 202 having a plurality of through substrate interconnects (TSIs) 208, e.g., two TSIs (identified individually as a first TSI 208a and a second TSI 208b). The SSL 200 can further include a plurality of SSEs 210, e.g., two SSEs (identified individually as a first SSE 210a and a second SSE 210b) electrically coupled to the TSIs 208. In the illustrated embodiment, the carrier substrate 202 includes a first surface 204 and a second surface 206 opposite the first surface 204 with the TSIs 208 extending from the first surface 204 to the second surface 206. In the SSL 200 illustrated in FIG. 2, the SSEs 210 each have a front side 212 and a back side 214 opposite the front side 212. The back side 214 of the first SSE 210a can be proximate (e.g., the closest surface of the SSE 210a) to the first surface 204 of the carrier substrate 202, and the back side 214 of the second SSE 210b can be proximate to the second surface 206 of the carrier substrate 202. The first and second SSEs 210a-b can be electrically coupled to both the first TSI 208a and the second TSI 208b. In further embodiments, the SSL 200 can include additional SSEs 210 proximate to the first surface 204 and/or the second surface 206 of the carrier substrate 202 with corresponding TSIs 208 electrically coupled to the SSEs 210.

The individual SSEs 210 can include a first semiconductor material 218 having a first contact 226, an active region 220, and a second semiconductor material 222 having a second contact 228. The first semiconductor material 218 can be an N-type semiconductor material, such as N-type gallium nitride ("N-GaN"), and the second semiconductor material 222 can be a P-type semiconductor material, such as P-type gallium nitride ("P-GaN"). The active region 220 can be indium gallium nitride ("InGaN"). The first semiconductor material 218, active region 220, and second semiconductor material 222 can be deposited sequentially using chemical vapor deposition ("CVD"), physical vapor deposition ("PVD"), atomic layer deposition ("ALD"), plating, or other techniques known in the semiconductor fabrication arts. In the embodiment illustrated in FIG. 2, the first semiconductor material 218 is at the front side 212 of each SSE 210, and the second semiconductor material 222 is at the back side 214. In other embodiments, the semiconductor materials can be reversed, such that the first semiconductor material 218 is at the back side 214 and the second semiconductor material 222 is at the front side 212.

The SSEs 210 can be configured to emit light in the visible spectrum (e.g., from about 390 nm to about 750 nm), in the infrared spectrum (e.g., from about 1050 nm to about 1550 nm), and/or in other suitable spectra. In some embodiments, the SSEs 210 can emit light having approximately equivalent wavelengths such that the SSL 200 emits a uniform color of light. In other embodiments, the first SSE 210a can emit light having a first wavelength and the second SSE 210b can emit light having a second wavelength different from the first wavelength such that the SSL 200 can emit more than one color of light and/or the wavelengths can be combined to create a different color of light.

In some embodiments, the SSEs 210 can optionally include a reflective material 242 attached with a transparent electrically conductive material (not shown) to the back side 214 of one or more SSEs 210. The reflective material 242 can be silver (Ag), gold (Au), copper (Cu), aluminum (Al), or any other suitable material that reflects light emitted from the active region 220 so as to redirect the light back through second semiconductor material 222, the active region 220, and the first semiconductor material 218. The reflective material 242 can have a high thermal conductivity. The reflective material 242 can also be selected based on the color of light it reflects. For example, silver generally does not alter the color of the reflected light. Gold, copper or other reflective, colored materials can affect the color of the light and can accordingly be selected to produce a desired color for the light emitted by the SSL 200. The transparent conductive material can be indium tin oxide (ITO) or any other suitable material that is transparent, electrically conductive, and adheres the reflective material to the second semiconductor material 222. The transparent conductive material and reflective material 242 can be deposited using CVD, PVD, ALD, plating, or other techniques known in the semiconductor fabrication arts.

To obtain certain colors of light from the SSL 200, a converter material 216 (e.g., phosphor, shown in dashed lines) can be placed over the SSL 200 such that light from the SSEs 210 irradiates energized particles (e.g., electrons and/or photons) in the converter material 216. The irradiated converter material 216 then emits light of a certain quality (e.g., color, warmth, intensity, etc.). Alternatively, the converter material 216 can be spaced apart from the SSL 200 in any other location that is irradiated by the SSL 200. In one embodiment, the converter material 216 can include a phosphor containing cerium (III)-doped yttrium aluminum garnet (YAG) at a particular concentration for emitting a range of colors from green to yellow and to red under photoluminescence. In other embodiments, the converter material 216 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. In additional embodiments, different converter materials 216 can be placed over the first SSE 210a and the second SSE 210b so the SSL 200 can emit multiple, different qualities of light. In further embodiments, the converter material 216 can differ on each surface (e.g., the first surface 204, the second surface 206, etc.) of the carrier substrate 202, such that the SSL 200 emits differing qualities of light from different surfaces. Each surface of the carrier substrate 202 can provide a natural barrier for differing converter materials 216, thereby simplifying the placement of different converter materials 216 on the SSE 200.

The carrier substrate 202 can comprise an aluminum nitride (ALN) material. Aluminum nitride is an electrically insulating ceramic with a high thermal conductivity. Thus, embodiments of SSL 200 including the aluminum nitride carrier substrate 202 can efficiently transfer heat from the SSEs 210 without interfering with the electrical properties of contacts, TSIs, leads, and/or other electrical features. The cooling effect of aluminum nitride is especially advantageous for back-to-back SSLs, such as the SSL 200, because the addition of SSEs 210 on multiple surfaces of the carrier substrate 202 can otherwise impede heat transfer from the SSL 200, which can degrade heat sensitive components. In other embodiments, the carrier substrate can comprise another suitable dielectric material (e.g., silicon).

The carrier substrate 202 can further include a plurality of leads 232 for providing electrical connections to the SSEs 210. For example, the carrier substrate 202 illustrated in FIG. 2 includes a first lead 232a coupled to a negative potential and a second lead 232b coupled to a positive potential. In further embodiments, the potentials can be reversed such that the first lead 232a couples to the positive potential and the second lead 232b couples to the negative potential. In still further embodiments, the carrier substrate 202 can include additional leads 232 to provide an electrical connection for additional SSEs 210.

The plurality of TSIs 208 extending through the carrier substrate 202 can include one or more electrically conductive materials. For example, the conductive material can comprise copper (Cu), aluminum (Al), tungsten (W), and/or other suitable substances or alloys. The TSIs 208 can further include a thermally conductive material that transfers heat away from the SSEs 210 to provide cooling for the SSEs 210. The TSIs 208 can be any shape and size suitable for electrical and/or thermal conductivity. In some embodiments, the TSIs 208 can be formed by removing portions of the carrier substrate 202 using etching, laser drilling, or other suitable techniques known to those skilled in the art. The resultant apertures in the carrier substrate 202 can be at least partially filled with the electrically conductive material(s) using plating, physical vapor deposition (PVD), chemical vapor deposition (CVD), or other suitable techniques known to those skilled in the art. If necessary, a portion of the carrier substrate 202 can be removed (e.g., by backgrinding) to form the TSIs 208. In other embodiments, the carrier substrate 202 can include pre-formed apertures that can be at least partially filled with the electrically conductive material(s). The TSIs 208 can be formed by removing a portion of the carrier substrate 202 using backgrinding or other techniques known in the art.

The TSIs 208 can provide an electrical connection between the SSEs 210 and the leads 232. In FIG. 2, for example, the first TSI 208a can be coupled to the first lead 232a and the second TSI 208b can be coupled to the second lead 232b, such that the first TSI 208a can be a negative terminal and the second TSI 208b can be a positive terminal. The exposed ends of the TSIs 208 at the first surface 204 of the carrier substrate 202 can be coupled to the first SSE 210a, and the exposed ends of the TSIs 208 at the second surface 206 of the carrier substrate 202 can be coupled to the second SSE 210b. In the embodiment illustrated in FIG. 2, the second semiconductor material 222 and the active region 220 of the each SSE 210 expose the first contact 226 on the first semiconductor material 218. The SSEs 210 having this configuration can include one or more conductive members 230 that couple the first contacts 226 to the exposed ends of the first TSI 208a and/or the second contacts 228 to the exposed ends of the second TSI 208b. In the embodiment illustrated in FIG. 2, the conductive members can be solder balls comprising copper (Cu), aluminum (Al), tungsten (W), and/or other suitable electrically conductive substances or alloys. In alternative embodiments, the first and second contacts 226 and 228 can be coupled to the corresponding TSIs 208 using different techniques known in the art (e.g., surface mounting, wirebonding, etc.).

In operation, the SSEs 210 convert electrical energy into electromagnetic radiation in a desired spectrum causing the first SSE 210a to emit light away from the first surface 204 of the carrier substrate 202 and the second SSE 210b to emit light away from the second surface 206. Thus, unlike conventional SSLs that emit light from a single plane, SSLs in accordance with the new technology (e.g., the SSL 200) can emit light from a plurality of planes. This can increase the intensity of illumination and/or create a wide angle of illumination (e.g., 360° of illumination). Additionally, since SSLs in accordance with the new technology utilize more than one surface of the associated carrier substrates, the SSLs can have a smaller footprint and/or a more compact size in the vertical and lateral directions than conventional SSLs that must be combined to create somewhat similar features. Thus, SSLs in accordance with the new technology can be particularly advantageous where three dimensional illumination is required (e.g., light posts) and/or where a high intensity of light in a small space (e.g., cell phones) is desired.

In the embodiment illustrated in FIG. 2, the first and second SSEs 210a-b are proximate to the first surface 204 and the second surface 206 of the carrier substrate 202 and have an angle of incidence of approximately 180°. In alternative embodiments, the SSEs 210 can be on more than two surfaces of the carrier substrate 202 and/or can have a smaller or larger angle of incidence between the SSEs 210. In one embodiment, for example, the carrier substrate 202 can be a hexagonal prism and include one or more SSEs 210 on each of its eight surfaces.

Figure 3:
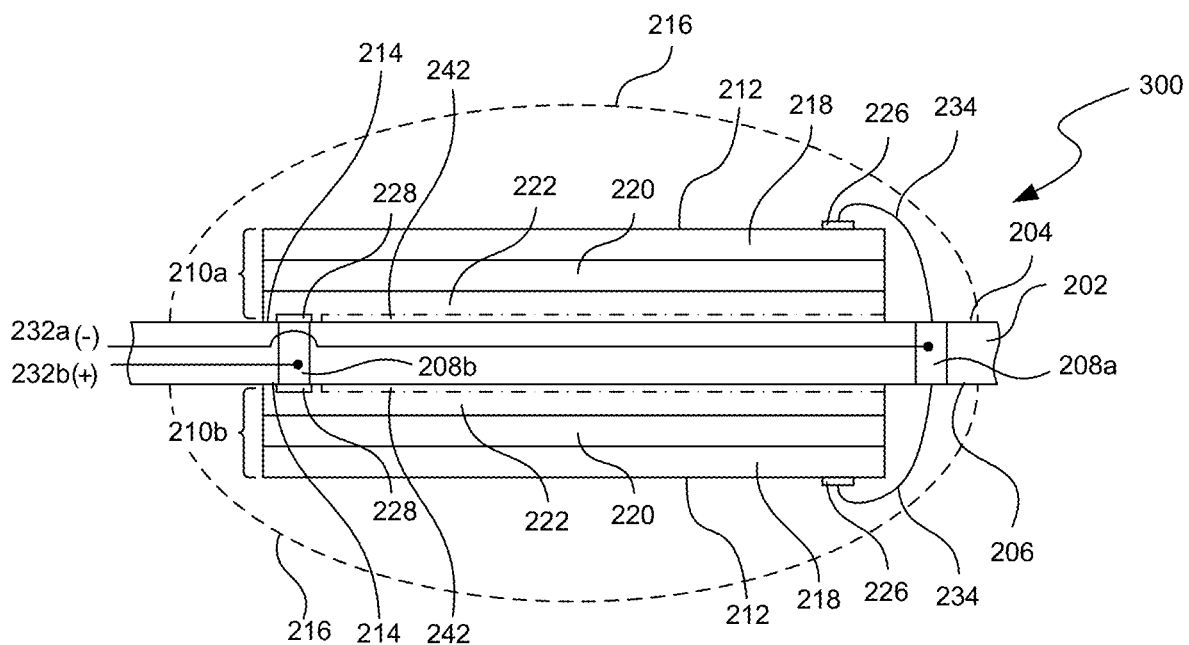
FIG. 3 is a partially schematic cross-sectional view of a back-to-back SSL in accordance with several other embodiments of the new technology.

FIG. 3 is a partially schematic cross-sectional view of a back-to-back SSL 300 in accordance with several embodiments of the new technology. Several features of the SSL 300 are generally similar to the features of FIG. 2 and are accordingly not described in detail below. The SSEs 210 shown in FIG. 3 include a wirebond 234 between the carrier substrate 202 and the SSEs 210. For example, in the illustrated embodiment, the first contacts 226 can be on the front surfaces 212 of each corresponding SSE 210 and the first TSI 208a can be laterally spaced apart from the SSEs 210, such that each first contact 226 can be electrically coupled to the corresponding exposed end of the first TSI 208a with the corresponding wirebond 234. The second contacts 228 can be surface mounted to the corresponding exposed ends of the second TSI 208b. In other embodiments, the first and second contacts 226 and 228 can be electrically coupled to the TSIs 208 using other suitable methods known to those skilled in the art. In the configuration illustrated in FIG. 3, only one contact (e.g., the second contact 228) need be aligned with a TSI 208 to form an electrical connection, thereby easing the alignment requirements during manufacturing.

Figure 4:
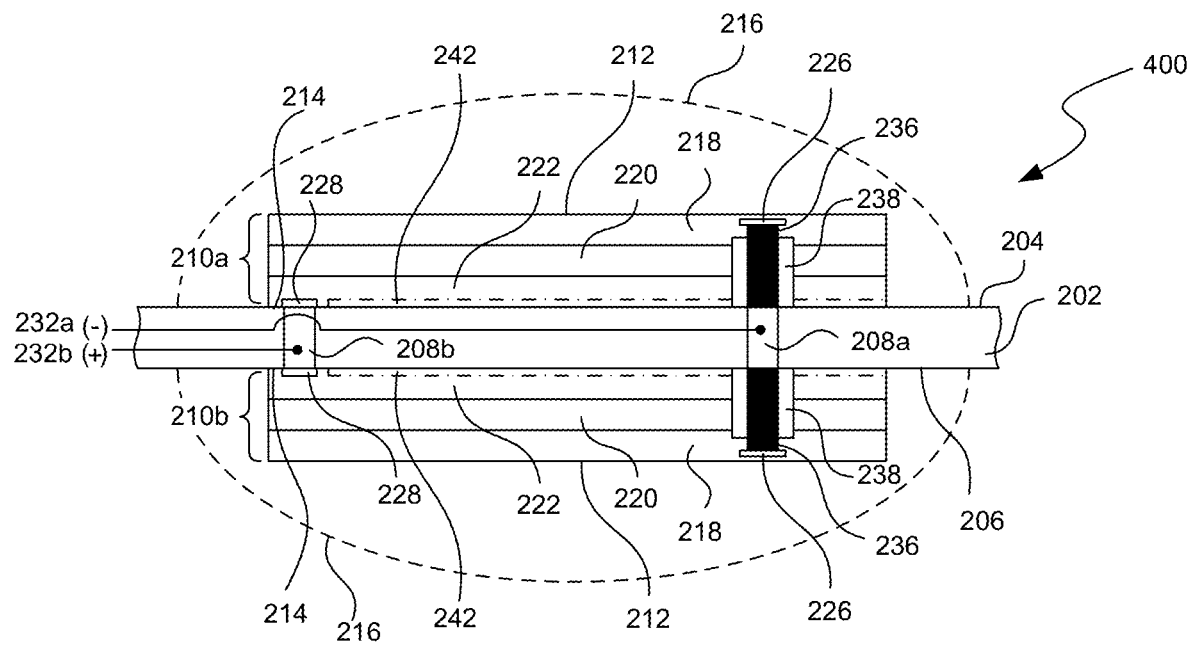
FIG. 4 is a partially schematic cross-sectional view of a back-to-back SSL in accordance with several further embodiments of the new technology.

FIG. 4 is a partially schematic cross-sectional view of a back-to-back SSL 400 in accordance with several embodiments of the new technology. Several features of the SSL 400 are generally similar to the features of FIGS. 2-3 and are accordingly not described in detail below. In FIG. 4, the first contacts 226 are buried contacts in the first semiconductor materials 218 of the first and second SSEs 210. The SSL 400 can include connectors 236 extending from each end of the first TSI 208a to the corresponding first contact 226 that electrically couple the two components. The connector 236 can comprise copper (Cu), aluminum (Al), gold (Au), tungsten (W), and/or other suitable conductive materials. The connector 236 can be at least partially surrounded by a dielectric material 238, such that the connector 236 is electrically isolated from portions of the SSE 210 other than the first contact 226 (e.g., the second semiconductor material 222 and the active material 220). In some embodiments, the connector 236 and the TSI 208 can be integrally formed. Advantageously, the buried contact allows the SSEs 210 to sit flush with the carrier substrate 202, thereby giving the SSL 400 a more compact size in the vertical and lateral directions.

Figure 5:
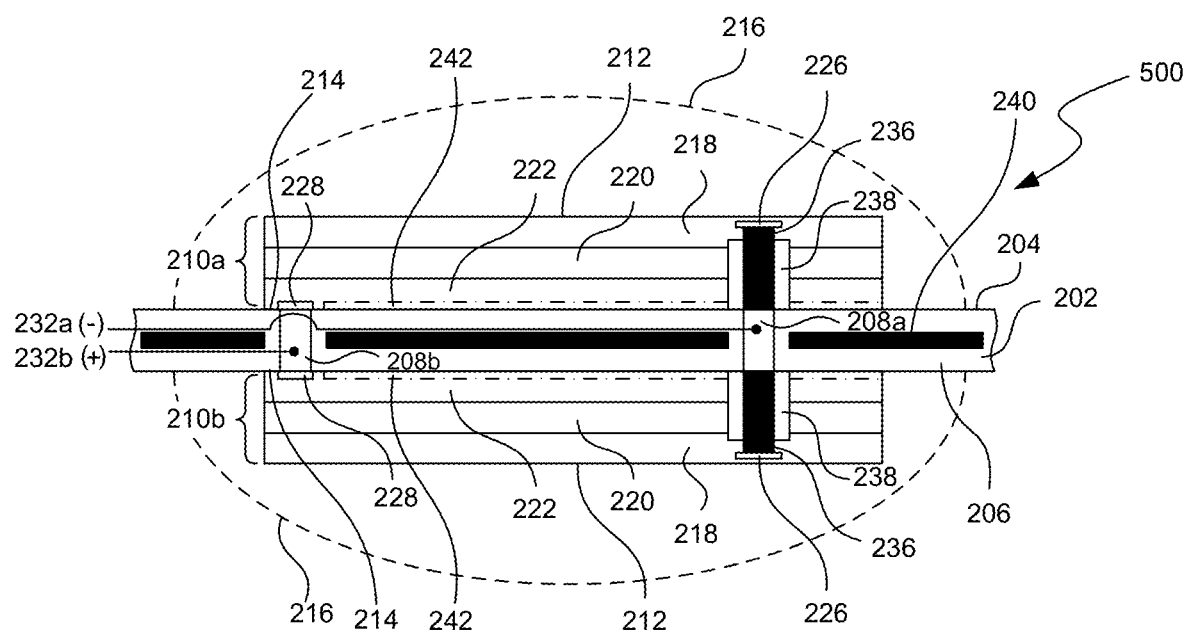
FIG. 5 is a partially schematic cross-sectional view of a back-to-back SSL in accordance with yet further embodiments of the new technology.

FIG. 5 is a partially schematic cross-sectional view of a back-to-back SSL 500 in accordance with several embodiments of the new technology. Several features of the SSL 500 are generally similar to the features of FIGS. 2-4 and are accordingly not described in detail below. In FIG. 5, the carrier substrate 202 further includes a conductive core 240 comprising a highly thermally conductive material, such as aluminum (Al), gold (Au), copper (Cu), and/or another suitable materials. In the illustrated embodiment, the conductive core 240 is electrically isolated from the TSIs 208, the SSEs 210, the leads 232, and/or other electrical features. The conductive core 240 can increase the transfer of heat away from SSEs 210 to provide cooling for the SSL 500. In some embodiments, the SSL 500 can include a carrier substrate comprising an aluminum nitride material and the conductive core 240 to provide exceptional cooling effects.

Figure 6:
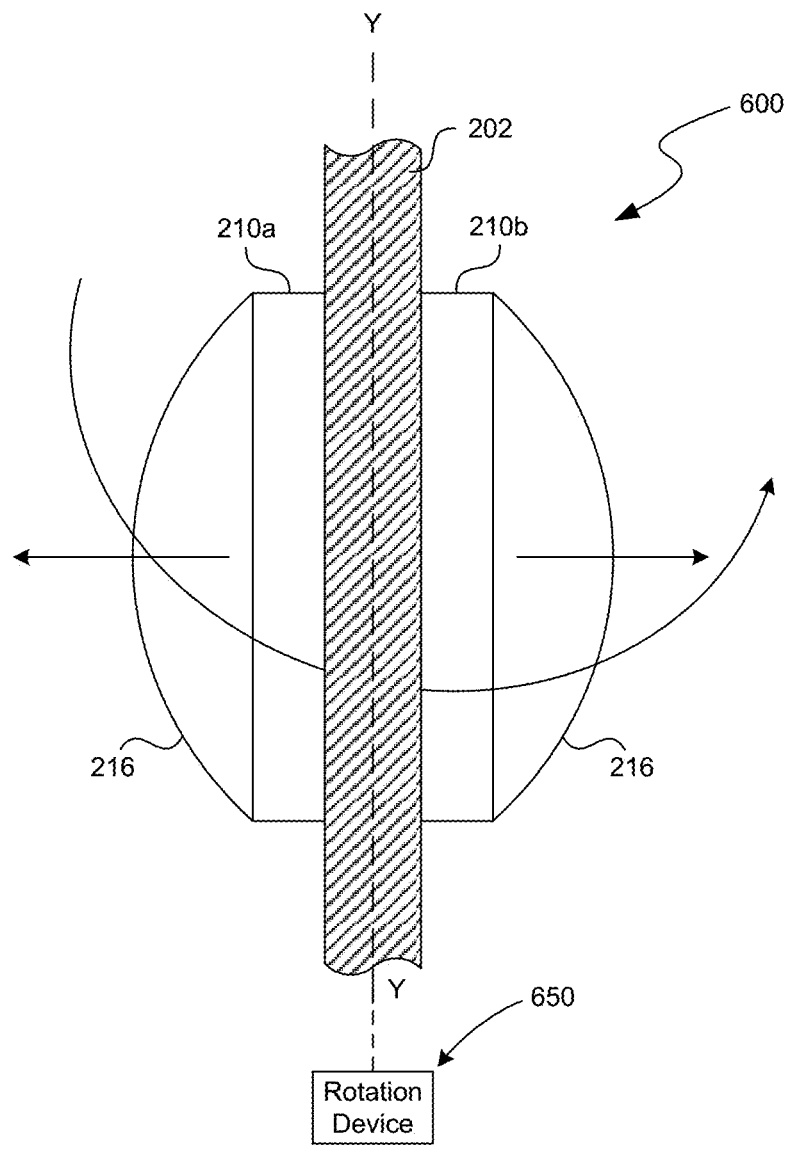
FIG. 6 is a partially schematic cross-sectional view of a rotatable back-to-back SSL in accordance with still further embodiments of the new technology.

FIG. 6 is a partially schematic cross-sectional view of a rotatable back-to-back SSL 600 in accordance with several embodiments of the new technology. The SSL 600 can include several features generally similar to any of the above SSLs described in FIGS. 2-5, such as the carrier substrate 202 and the plurality of SSEs 210. The SSL 600 can further include a rotation device 650 configured to rotate the SSEs 210 around one or more axis, such as the axis Y-Y. In one embodiment, the rotation device 650 can spin the SSEs 210 at a first speed such that the SSL 600 emulates a blinking light. For example, each SSE 210 can emit a stream of light and the rotation device 650 can spin the SSL 600 at a first speed, such that the human eye can perceive the intermittent breaks in the light as the SSL 600 rotates to expose surfaces of the carrier substrate 202 without light emitted by the SSEs 210. In another embodiment, the rotation device 650 can spin the SSL 600 at a second speed higher than the first speed, such that the SSL 600 emulates a generally constant stream of light at a point spaced apart from the SSL 600. For example, a generally constant stream of light means the rotation device 650 can spin the SSL 600 at a speed that prevents the human eye from perceiving surfaces of the carrier substrate 202 without the SSEs 210. In some embodiments, the first SSE 210a can emit a first color of light and the second SSE 210b can emit a second color of light different than the first color, such that the first and second colors of light can combine to emit a third color of light when the rotation device 650 spins the SSL 600 at the second speed. In further embodiments, the SSEs can emit more than two colors of light. In still further embodiments, the SSL 600 can include additional SSEs on one or more surfaces of the carrier substrate, and/or the rotation device 650 can spin the SSL 600 at varying speeds around one or more axis.

From the foregoing, it will be appreciated that specific embodiments of the present technology have been described herein for purposes of illustration, but that various modifications may be made without deviating from the technology. For example, the embodiments illustrated in FIGS. 2-6 include through substrate interconnects having a straight trajectory. However, other embodiments of the new technology can include through substrate interconnects having angled, curved, and/or other trajectories that can electrically connect SSEs on different surfaces of carrier substrates. Certain aspects of the new technology described in the context of particular embodiments may be combined or eliminated in other embodiments. For example, the SSL of FIG. 6 can include any of the foregoing SSL arrangements. Additionally, an SSL in accordance with the technology can include a combination of SSEs having any one of the forgoing configurations. For example, an SSL can include a SSE as illustrated in FIG. 2 and another SSE as illustrated in FIG. 4. Further, while advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A solid state light (SSL), comprising:
a carrier substrate having a first electrically insulative material at a first surface of the carrier substrate and a second electrically insulative material at a second surface opposite the first surface;
a through substrate interconnect (TSI) extending from the first surface to the second surface;
a first solid state emitter (SSE) mounted over the first surface of the carrier substrate overlapping and electrically coupled to the first TSI;
a first reflective material in direct contact with the first electrically insulative material and between the first surface of carrier substrate and the first SSE;
a second SSE mounted over the second surface of the carrier substrate overlapping and electrically coupled to the first TSI; and
a second reflective material in direct contact with the second electrically insulative material and between the second surface of carrier substrate and the second SSE.

2. The SSL of claim 1, wherein:
the first SSE comprises a first semiconductor material at a first side of the first SSE, a second semiconductor material at a second side of the first SSE opposite the first side, wherein the second side faces the first surface of the carrier substrate, wherein the first semiconductor material includes a first contact and the second semiconductor material includes a second contact,
the second SSE comprises a first semiconductor material at a first side of the second SSE, a second semiconductor material at a second side of the second SSE opposite from the first side, wherein the second side faces the second surface of the carrier substrate, and wherein the first semiconductor material includes a first contact and the second semiconductor material includes a second contact, and
the first contacts of the first and second SSEs are electrically coupled to the first TSI, and
the second contacts of the first and second SSEs are electrically coupled to a second TSI extending from the first surface of the carrier substrate to the second surface of the carrier substrate.

3. The SSL of claim 2, wherein:
the second contact of the first SSE is exposed; and
the second contact is electrically coupled to the second TSI with a conductive member.

4. The SSL of claim 2, wherein the first contacts of the first and second SSEs are buried contacts, further comprising:
a first aperture in the first SSE, wherein the first aperture extends from the second side of the first SSE to the first contact buried in the first SSE;
a second aperture in the second SSE, wherein the second aperture extends from the second side of the second SSE to the first contact buried in the second SSE;
a first electrical connector extending from the first TSI through the first aperture to the first contact buried in the first SSE;
a second electrical connector extending from the first TSI through the second aperture to the first contact buried in the second SSE; and
a dielectric material in the first and second apertures, wherein the dielectric material is configured to electrically isolate the first and second electrical connectors from at least the second semiconductor material.

5. The SSL of claim 1 wherein the carrier substrate comprises aluminum nitride.

6. The SSL of claim 2 wherein the carrier substrate comprises a conductive core electrically isolated from the first and second TSIs and the first and second SSEs.

7. The SSL of claim 1, further comprising:
a rotation device coupled to the first and second SSEs to rotate the first and second SSEs around at least one axis.

8. The SSL of claim 7 wherein the rotation device rotates the SSL at a speed at least sufficient to emulate a generally constant stream of light from the SSL.

9. The SSL of claim 8 wherein the rotation device rotates the SSL at a speed that produces intermittent flashes of light from the SSL.

10. The SSL of claim 1 wherein the first SSE is one of a plurality of first SSEs, the second SSE is one of a plurality of second SSEs, and the first TSI is one of a plurality of first TSIs corresponding to the plurality of first and second SSEs.

11. The SSL of claim 1 wherein the first SSE emits a first color of light and the second SSE emits a second color of light different from the first color of light.

12. The SSL of claim 1, further comprising:
a first converter material at least partially over the first SSE; and
a second converter material different from the first converter material at least partially over the second SSE.

13. The SSL of claim 1, further comprising:
at least one additional SSE mounted to a third surface of the carrier substrate, wherein the first TSI is electrically coupled to the additional SSE.

14. A solid state light (SSL), comprising:
a carrier substrate having a first electrically insulative material at a first surface of the carrier substrate and a second electrically insulative material at a second surface opposite the first surface;
a first through substrate interconnect (TSI) extending from the first surface to the second surface;
a second TSI extending from the first surface to the second surface;
a first solid state emitter (SSE) mounted over the first surface of the carrier substrate overlapping the first TSI and electrically coupled to the first and second TSIs;
a first reflective material in direct contact with the first electrically insulative material and between the first surface of carrier substrate and the first SSE;
a second SSE mounted over the second surface of the carrier substrate overlapping the first TSI and electrically coupled to the first and second TSIs; and
a second reflective material in direct contact with the second electrically insulative material and between the second surface of carrier substrate and the second SSE.

15. The SSL of claim 14, wherein the first and second TSIs are electrically coupled to the second TSI with respective first and second conductive members.

16. The SSL of claim 15, wherein the first and second conductive members comprise wirebonds.

17. The SSL of claim 14 wherein the carrier substrate comprises aluminum nitride.

18. The SSL of claim 14 wherein the first SSE emits a first color of light and the second SSE emits a second color of light different from the first color of light.

19. The SSL of claim 14, further comprising:
a first converter material at least partially over the first SSE; and
a second converter material different from the first converter material at least partially over the second SSE.

20. A solid state light (SSL), comprising:
a carrier substrate having a first electrically insulative material at a first surface of the carrier substrate and a second electrically insulative material at a second surface different from the first surface;
a first through substrate interconnect (TSI) extending from the first surface to the second surface;
a second TSI extending from the first surface to the second surface;
a first solid state emitter (SSE) mounted over the first surface of the carrier substrate overlapping the first TSI and electrically coupled to the first and second TSIs;
a first reflective material in direct contact with the first electrically insulative material and between the first surface of carrier substrate and the first SSE;
a second SSE mounted over the second surface of the carrier substrate overlapping the first TSI and electrically coupled to the first and second TSIs; and
a second reflective material in direct contact with the second electrically insulative material and between the second surface of carrier substrate and the second SSE.

* * * * *